US007795887B2

(12) United States Patent
Glazer et al.

(10) Patent No.: US 7,795,887 B2
(45) Date of Patent: Sep. 14, 2010

(54) PHOTOCONDUCTIVE BASED ELECTRICAL TESTING OF TRANSISTOR ARRAYS

(75) Inventors: Arie Glazer, Mevaseret Zion (IL); Ilya Leizerson, Haifa (IL); Abraham Gross, Ramat Aviv (IL); Raanan Adin, Kiryat Ono (IL); Raphael Ben-Tolila, Kiryat Gat (IL)

(73) Assignee: Orbotech Ltd, Yavne (IL)

( * ) Notice: Subject to any disclaimer, the term of this patent is extended or adjusted under 35 U.S.C. 154(b) by 180 days.

(21) Appl. No.: 12/089,421

(22) PCT Filed: Oct. 15, 2006

(86) PCT No.: PCT/IL2006/001179

§ 371 (c)(1),
(2), (4) Date: Apr. 7, 2008

(87) PCT Pub. No.: WO2007/043051

PCT Pub. Date: Apr. 19, 2007

(65) Prior Publication Data

US 2008/0224724 A1    Sep. 18, 2008

Related U.S. Application Data

(60) Provisional application No. 60/724,875, filed on Oct. 11, 2005.

(51) Int. Cl.
*G01R 31/302* (2006.01)
*G01R 31/00* (2006.01)

(52) U.S. Cl. ..................... 324/752; 324/770
(58) Field of Classification Search .............. 324/158.1, 324/769–770
See application file for complete search history.

(56) References Cited

U.S. PATENT DOCUMENTS

| 5,982,190 | A  | * | 11/1999 | Toro-Lira | ............ 324/770 |
| 6,545,500 | B1 | * | 4/2003 | Field | ............ 324/770 |
| 6,693,417 | B2 | * | 2/2004 | Wilson | ............ 324/158.1 |
| 7,149,343 | B2 | * | 12/2006 | Enachescu et al. | ............ 382/149 |
| 7,598,755 | B2 | * | 10/2009 | Furukawa et al. | ............ 324/753 |
| 2003/0222220 | A1 | * | 12/2003 | Enachescu et al. | ............ 250/341.6 |

* cited by examiner

*Primary Examiner*—Ha Tran T Nguyen
*Assistant Examiner*—Joshua Benitez
(74) *Attorney, Agent, or Firm*—Sughrue Mion, PLLC

(57) ABSTRACT

An apparatus is provided for testing microelectronic components on a substrate, including a scanner operative to scan a light beam over a plurality of thin film transistors disposed on a substrate, one transistor at a time, so as to induce a photoconductive response in the plurality of transistors, one transistor at a time; current sensing circuitry operative, synchronously with said scanner, to measure an output induced by the photoconductive response associated with a transistor and to generate photoconductive response output values, the photoconductive response output values representing a photoconductive response induced by the light beam, for one transistor at a time from among the plurality of transistors; and diagnostic apparatus operative to analyze the electronic response output values and to characterize each of the transistors in accordance therewith.

33 Claims, 14 Drawing Sheets

PHOTOCONDUCTIVE BASED ELECTRICAL TESTING OF TRANSISTOR ARRAYS

REFERENCE TO CO-PENDING APPLICATIONS

This application claims the benefit of U.S. Provisional Patent Application No. 60/724,875, filed on Oct. 11, 2005, the disclosure of which is incorporated by reference in its entirety.

FIELD OF THE INVENTION

The present invention relates generally systems and methods for testing microelectronic components such as arrays of transistors in flat panel displays.

BACKGROUND OF THE INVENTION

Flat panel displays include microscopic features, such as thin film transistors, capacitors, interconnections and the like, which require testing at various stages of fabrication in order to ensure that the display meets specified performance requirements.

The disclosures of all publications mentioned in the specifications, and of the publications cited therein directly or indirectly, are hereby incorporated by reference.

SUMMARY OF THE INVENTION

The present invention seeks to provide an improved method and system for testing objects with active microscopic features such as transistor arrays and diodes.

The following terms are used in the description that follows:

TFT is a thin film transistor.

Source line or data line is a conductor line connected to a source contact of one or more transistors that provides an electrical signal to those transistors.

Gate line or address line is a conductor line that is a connected to a transistor gate that controls the on/off state of transistors, namely whether a transistor is available (on state) or unavailable (off state) to receive an electrical signal from the transistor data source.

Drain line or common line is a conductor line which connects to the transistor drains which operate an electronic component, such as an electrode in a pixel.

$V_g$ is a voltage applied to a gate line to control the on/off state of a line of a plurality of transistors.

$V_{sd}$ is a voltage applied to a source or data line to govern operation of transistors. Typically $V_{sd}$ is applied individually to transistors.

$V_{out}$ and $I_{out}$ are electronic responses (voltage and current, respectively) to photo excitation that may be measured.

ITO (indium tin oxide) and IZO (indium zinc oxide) are materials used in conventional flat panel displays to form transparent electrodes that govern the operation of pixels on a flat panel display.

In accordance with an embodiment of the invention, arrays of thin film transistors formed on an in-fabrication display panel are electrically tested by exciting selected transistors using a light beam, and then measuring an electrical response or characteristic resulting from excitation by a light beam. The measured electrical characteristic may be for example a voltage or a current response resulting from photoconductively induced current due to light excitation, provided for example by a light beam such as a laser, of the semiconductor material from which a transistor is formed.

In an embodiment of the invention, a light beam is applied to selected transistors formed on an in-fabrication flat panel display, for example by sequentially scanning pixel locations on an in-fabrication display, to induce a photoconductive response in transistors at the selected locations. As noted, the light beam may be provided by a suitable laser although this need not be the case as other suitable sources of light beams may be employed. The resulting electronic signal may be measured, for example, as current or as voltage.

At least the transistor being tested, namely that transistor being subjected to excitation by a light beam, is in an off state when excited by the beam, for example by applying an appropriate typically negative bias to the gate and source contacts of the transistor being tested. Testing is typically conducted in a state of darkness and neighboring transistors may be and in an embodiment of the invention are also put in an off state during testing. The off state is induced, for example, by subjecting these transistors to negative voltage bias at gate and source shorting bars, so that normally there should not be a flow of electrical current other than leakage current.

Excitation induced by the light beam generates photoconductive electron hole pairs in semiconductor material of the transistor, consequently enabling monitoring of an electronic (e.g. photocurrent) response of the light-excited transistor. The photocurrent signal generated by light excitation of the channel material in a transistor is monitored, for example, for shape and magnitude. This information is used as reference data for determining pixel quality and functionality.

In accordance with an embodiment of the invention, a plurality of transistors surrounding a transistor being tested, are all placed in an off state and subjected to a negative electrical potential to avoid the flow of current. This reduces undesirable electronic interference from neighboring transistors and facilitates measurement of a photoconductive response induced on a given transistor by a light beam.

In accordance with an embodiment of the invention, electrical signals (namely the bias putting transistors to be tested in an off state) are cyclically applied to the transistors to avoid degradation of electrical characteristics of transistors. The light beam is supplied to transistors, one at a time, in synchrony with provision of the cyclically applied electrical signals so that the laser beam excites a transistor when that transistor is put in its off state.

It is appreciated that a typical in-fabrication flat panel display has numerous transistors each of which needs to be tested. Generation of photoconductive induced current by illuminating a transistor makes possible the determination of various suspected defects, not only of transistors, but also of other electronic components such as capacitors and electrical interconnections that are associated with a tested transistor. The testing may be performed at various stages during the fabrication of a flat panel display, whether such stages precede or follow the formation of electrodes such as ITO and IZO electrodes.

There is thus provided in accordance with an embodiment of the invention a method and suitable apparatus for carrying out the method, for inspecting micro-electronic components on a substrate comprising applying a control signal to a multiplicity of microelectronic components disposed on a substrate so as to cyclically place the microelectronic components in an "off" state; scanning the multiplicity of semiconductor components with at least one light beam so as to induce an electronic response from selected microelectronic components among the multiplicity of microelectronic components, the scanning being synchronized with placing the components in an "off" state; and during the scanning, measuring an electronic response from at least one microelectronic component, thereby to detect an electric characteristic. Typically the spot size of a light excitation beam is smaller than the pitch of pixel locations, and transistors are scanned one at a time, while the substrate is in darkness, so that the response of individual pixels can be measured to determine defects in individual defects or circuitry associated with a particular pixel.

There is also provided, in accordance with an embodiment of the invention, apparatus for testing microelectronic components on a substrate, the apparatus including a scanner operative to scan a light beam over a plurality of thin film transistors disposed on a flat panel display substrate, one transistor at a time, so as to illuminate the plurality of transistors, one transistor at a time; and induce therein a photoconductive response, current or voltage sensing circuitry operative, synchronously with the scanner, to measure an output induced by the photoconductive response associated with a transistor and to generate photoconductive response output values, the photoconductive response output values representing a photoconductive response induced by the light beam, for one transistor at a time from among the plurality of transistors; and diagnostic apparatus operative to analyze the electronic response output values and to characterize each of the transistors in accordance therewith.

BRIEF DESCRIPTION OF THE DRAWINGS

Embodiments of the present invention are illustrated in the following drawings.

DETAILED DESCRIPTION

Figure 1:
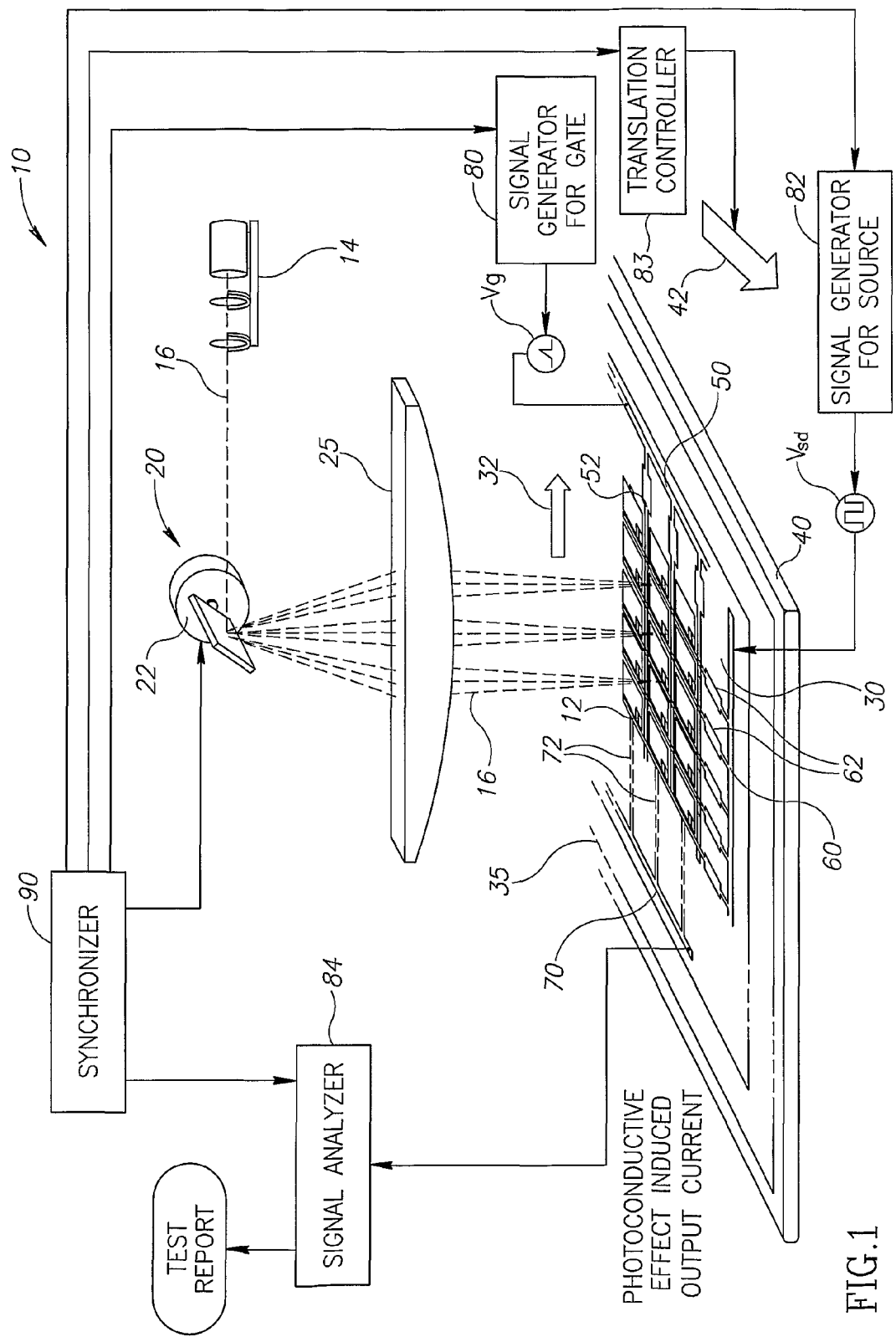
FIG. 1 is a simplified pictorial illustration of a system for photoconductive effect-based testing of a display panel array or other transistor array, constructed and operative in accordance with an embodiment of the present invention.

Reference is now made to FIG. 1 which schematically illustrates a system 10 for performing electrical testing of an array of thin film transistors 12, disposed for example, on an in-fabrication flat panel display, or other suitable transistor array. FIG. 1 shows an embodiment of the invention in which a light source unit 14, configured as a laser, outputting a light (laser) beam 16 is operative in conjunction with a scanner 20, comprising for example a rotating mirror unit 22, and suitable optical elements such as an F-theta lens 25 to sequentially illuminate each of a plurality of transistors 12 disposed on a transistor array substrate 30 in a scan direction designated 32. Light beam 16 may be projected or otherwise suitably imaged onto substrate 30 by suitable optics. Additional optical components and other inconsequential details, typical of scanning laser systems, are not shown in order to avoid obfuscating key teaching points of the invention. Although the system in FIG. 1 is shown as employing a light source configured as a laser outputting a laser beam and employing a scanner configured as a rotating mirror, this need not be the case inasmuch as other suitable light beam sources and scanner devices may be employed. As used in this description, reference to a laser beam includes reference to any suitable light beam, and reference to a scanner device is not limited to a rotating polygon type scanner as seen in FIG. 1.

Transistor array substrate 30 typically is grounded, for example via a ground line 35, and is positioned on a stage 40 which translates display substrate 30 in a cross scan direction designated 42. The transistor array substrate 30 being tested, as shown in FIG. 1, is illustrated as still in production, and is provided with gate shorting bars 50 interconnecting gate lines 52, data shorting bars 60 interconnecting data lines 62, and drain shorting bar 70 interconnecting transistor drains via drain lines 72. Drain lines 72 may be connected directly to transistors 12, or indirectly connected thereto, for example, via a capacitor (not shown). The respective gate lines, signal lines and drain lines may be interconnected in various manners as a function of the architecture of a transistor array, such as a flat panel display, and the stage of fabrication of substrate 30. It is noted that in many transistor array architectures drains are not interconnected.

As seen in FIG. 1, system 10 additionally is provided with a gate signal generator 80 outputting a signal $V_g$ to gate shorting bar 50, a source signal generator 82 outputting a signal $V_{sd}$ to signal shorting bar 60 and a signal analyzer 84 receiving photoconductive effect induced output from drain shorting bar 70, which is indicative of the soundness transistors 12 and other components disposed on substrate 30, or defects therein. A synchronizer 90 is operatively associated with gate signal generator 80, source signal generator 82, signal analyzer 84, scanner 20 and a translation controller 83, governing cross scan translation of substrate 30 indicated by arrow 42.

As will be described in greater detail hereinbelow, synchronizer 90 governs synchronous operation of signal generators 80 and 82 along with operation of scanner 20 and a motion translator (not shown) such that light beam 16 is sequentially applied to each of the transistors 12 at times when the transistors 12 are biased such that normally there would not be a flow, or leakage, of electrical current from transistors 12 on substrate 30. In an embodiment of the invention, light beam 16 is applied to transistors individually; optionally it is applied to selected groups of transistors. It is appreciated that the bias on transistors 12 is not continuous but rather cycled from an on state to an off state in order to avoid degradation of electrical characteristics of the transistors.

When light beam 16 is applied to a given transistor, that transistor generates a photoconductive induced current, despite the bias applied to the transistors generally, which is received by signal analyzer 84, also governed by synchronizer 90. Analyzer 84 analyzes the photoconductive induced current associated with the photo-excited transistor to determine whether or not the electrical performance of the transistor, and its associated componentry, is sound or defective.

Figure 2A:
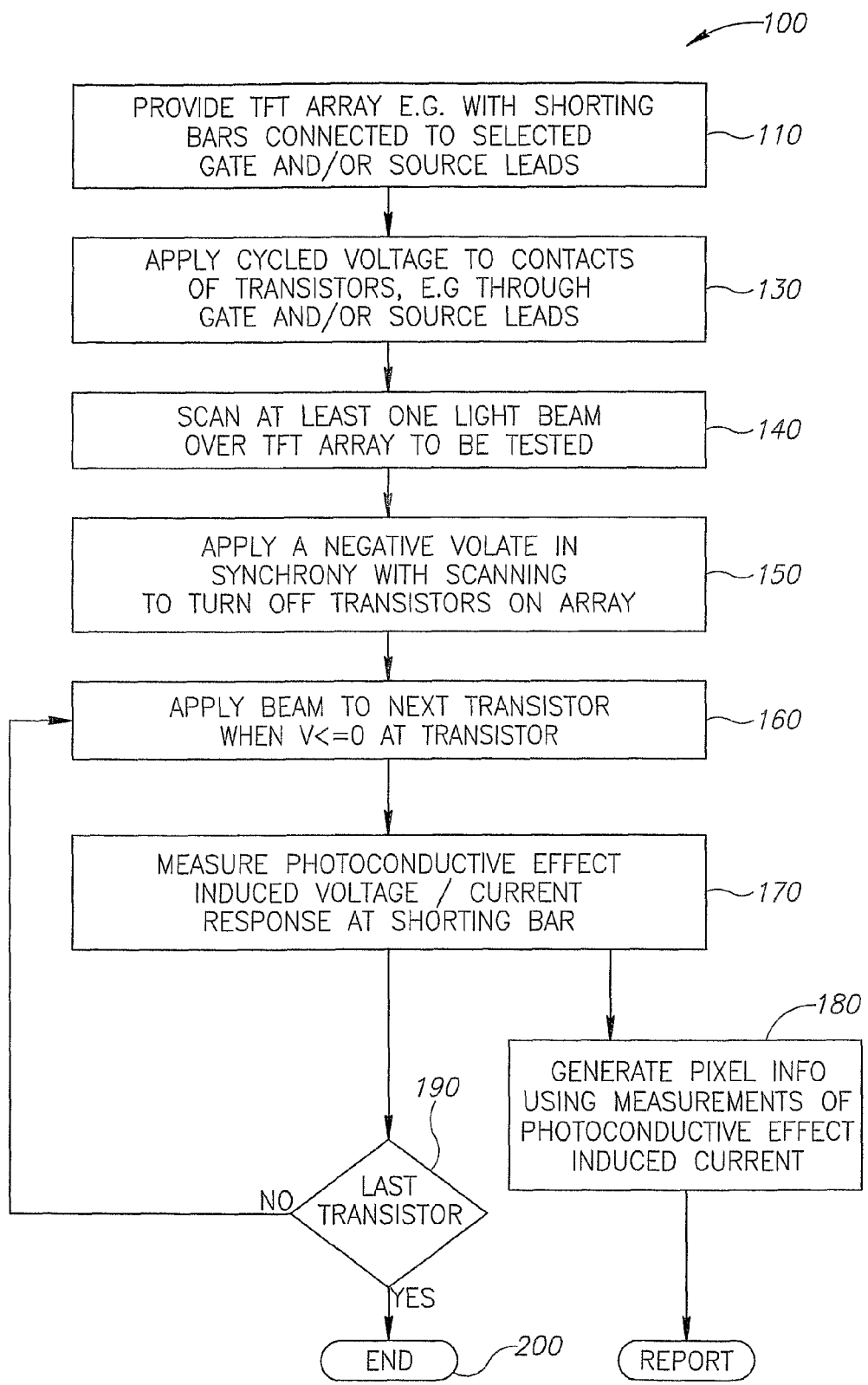
FIG. 2A is a simplified flowchart illustration of a method of operation of the system of FIG. 1.

Referring now also to FIG. 2A, in an embodiment of the invention, testing of an array of transistors disposed on a substrate, for example an in-fabrication flat panel display substrate, employing the system shown in FIG. 1 above, proceeds as follows:

An array of transistors 12, for example a TFT array formed on a substrate 30, such as an in-fabrication flat panel display, is provided with shorting bars that are connected to selected leads of a plurality of transistor components (operation 110), typically gate and source leads. An electrical signal, typically applied as a voltage potential, having a cyclical waveform, is applied through shorting bars 50 and 60, to gate and/or source contacts of transistors 12 disposed on substrate 30 (operation 130). While the cyclical electrical signal is being applied to a plurality of transistors 12 disposed on substrate 30, at least one light beam 16 is scanned over the plurality of transistors, which are arranged in an array (operation 140).

The cyclical electrical signal and scanning of the laser beam are synchronized in the following manner: while a periodic negative voltage potential is applied to the gate lines 52 through gate shorting bar 50, a synchronized negative voltage potential is also applied to the source lines 62 through source shorting bar 60. This puts the transistors in an off state thereby resulting in an absence, or near absence, of current flow on substrate 30. Periodic turning off of transistors 12 is synchronized with scanning of the laser beam from one transistor 12 to the next transistor 12 (operations 150 and 160). The application of a laser beam to a transistor induces a measurable electrical response therein due to the photoconductive effect of the exposure of the transistor semiconductor material to light. Typically, testing is performed while maintaining substrate 30 in a state of darkness so that a measured electrical response may be correlated to selected transistors. In an embodiment of the invention this electrical response is measured at a shorting bar either as current or as voltage (operation 170). Pixel information characterizing the performance of a pixel using measurement of photoconductively induced current is generated (operation 180), and a report is generated.

The operation of cyclically applying a negative voltage potential proceeds in synchrony with scanning the light beam 16 from transistor to transistor until the laser reaches the final transistor on substrate 30 to be tested (operation 190), at which point this method of testing for a given substrate 30 terminates, represented schematically by block 200.

Figure 2B:
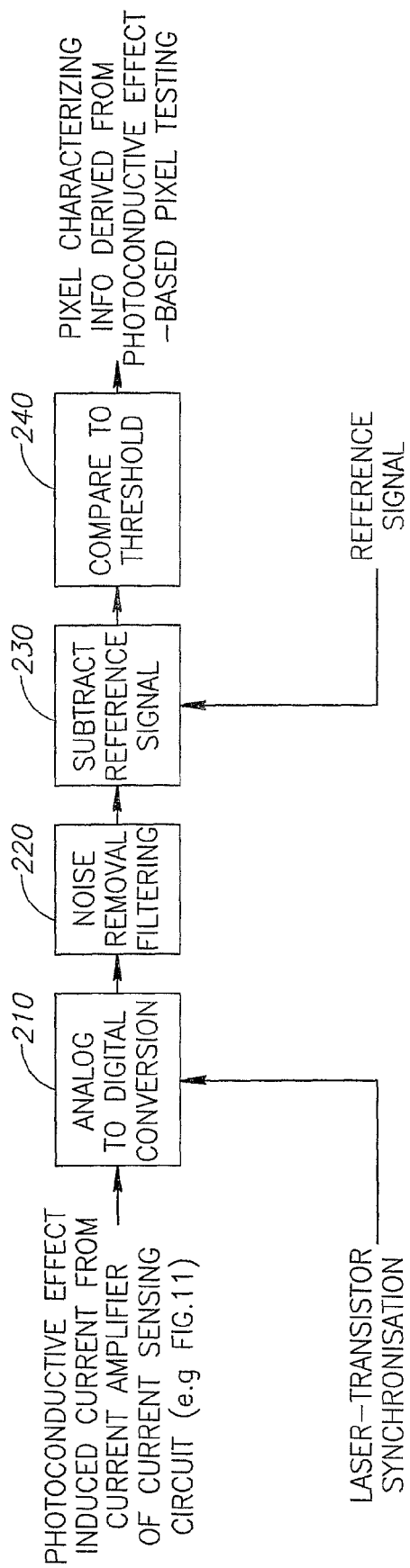
FIG. 2B is a simplified flowchart illustration of an implementation of step 180 of the method of FIG. 2A.

Turning now to FIG. 2B, the operation 180, in which the measured electrical response to current photoconductively induced by light beam 16 is analyzed, includes the following sub-operations. It should be noted that a computer typically is used to perform the analysis described herein in an automated manner.

Current induced by light beam 16 impinging on a given test transistor as described above, is amplified and provided to an A-to-D converter at a high frequency, such as 10 MHz at 12 bit, whereat the analog current signal is converted to a digital signal (operation 210). The amplified current signal is provided, for example, by the circuitry described below with reference to FIG. 9. The timing of the provision of the amplified current signal corresponding to a test transistor, and the operation of the A-to-D and downstream circuitry are synchronized with the scanning so that analysis of the current can be identified with a given test transistor.

Subsequently, the digital signal is filtered to remove noise (operation 220) and subtracted from an input reference signal that corresponds to a signal associated with a photo excited transistor that is properly formed on a similar substrate (operation 230). The reference signal may be from a transistor that is known to be good on an actual substrate panel, or synthetically derived e.g. by algorithmic analysis. The result of subtracting the test signal from the reference signal is then compared to a predetermined threshold value (operation 240) and a determination is made whether the test transistor and/or microelectronic components in a given pixel associated with the test transistor, is properly formed, or otherwise.

In accordance with an embodiment of the invention, the shape of the test signal is compared to a reference signal, and the absolute value of the difference between the measured and reference signals is integrated over time and compared to a threshold value. The difference may be computed by simply subtracting signal values of the two signals, once synchronized to one another. If the difference (or alternatively another characteristic parameter such as the maximum difference) is greater than a predetermined threshold value, the pixel associated with the test transistor is suspected as having a defect.

Defects may be characterized by comparison to profiles e.g. reference signals that correspond to or indicate different types of defects. Defect profiles may be generated empirically be examining an electronic response when transistors in pixels having different types of defects are photo-excited, algorithmically. Induced current from test transistors is compared to one or more of these profiles in order to determine the reference profile to which a test signal is most similar. Typically, non-defective pixels on different panel architectures have their own characteristic reference signal due to variations in the structure of transistors, capacitors and other micro-electronic components employed in the different panel architectures.

If the electronic signal associated with a test transistor is not similar to any of the profiles, the electronic signal may be classified as indicative of an unknown defect.

Empirical testing may be carried out, for example, in a set-up stage using the system and method of FIGS. 1-2B, to generate profiles for various defects including defects in transistors, short and open defects in conductor lines, defects in pixel capacitors associated with test transistors, and other types of defects.

In accordance with an embodiment of the invention, the current profile output from a test transistor being illuminated is compared to the various profiles using a conventional distance function such as a sum of absolute differences. If the distance function from the current profile of a test transistor exceeds a threshold corresponding to a non-defective transistor, then the transistor, or the pixel associated with the test transistor, is deemed to be suffering from a defect, and further classification is required. If the signal from a test transistor is found to be close to but below the threshold distance value for one of the defect profiles, the pixel associated with the test transistor is deemed to be suffering from the defect typified by that profile. If the signal is found to be close to but below the threshold distance value for more than one of the profiles, the pixel to which the signal corresponds may be deemed to be suffering from the defect typified by the profile to which the signal is closest.

Upon identification of defective pixels, further inspection, for example for the purpose of verification or defect classification may be desired. In accordance with an embodiment of the invention, further verification and classification is performed, for example, on automated optical inspection and/or verification systems such as the Pointer™ AOI system available from Orbotech Ltd., of Yavne, Israel, or other suitable high resolution microscope. Verification and classification may be performed either manually or using automated apparatus. The results of defect classification are typically employed as part of a program for process control and improvement.

Further structural and operational details of a system constructed and operative in accordance with an embodiment of the invention are now provided.

Referring now once again to FIG. 1, in the illustrated optical system the light beam source 14 may be a laser or other suitable light source outputting a beam 16 that is focused onto the panel 30. The beam spot size typically will be smaller than the minimal expected dimension, or pitch, of a pixel to be formed on panel 30. The wavelength and output power of beam 16 are selected to be sufficiently powerful to generate a sufficiently large amounts of charge carriers so as to produce a measurable current, when a transistor 12 on panel 30 is illuminated. The inventors have found that 15 mW red laser diode is suitable to stimulate photo excitation of transistors 12 without damaging the transistors. Such diodes are readily commercially available from various manufacturers, including Toshiba for example. The light output may be continuous or pulsed, for example a pulsed laser that is pulsed by an electro-optical switch. When the light output is pulsed, care must be taken to ensure that when scanning, a light pulse is delivered to each transistor to be tested at the appropriate time—namely when transistors are placed in their "off" state. It is noted that other suitable light sources, including light emitting diodes, HeNe lasers and green lasers (frequency doubled Nd:YAG) may be also be suitable.

Suitable scanners 20 include, rotating polygon scanners, acousto-optical deflectors, fast steering mirrors of the type shown and described in Assignee's copending U.S. patent application Ser. No. 11/472,325, filed on Jun. 22, 2006 and entitled "Tilting Device"; as well as other suitable galvo mechanisms and resonance mirror scanners inter alia.

Regarding focusing optics, due to the size of pixels (in the order of 100×300 microns) found on typical flat panel displays, the diameter of the light spot for stimulating individual semiconductor devices for testing as shown and described above, typically is in the order of tens of microns. Suitable scan-lens typically include F-theta optical elements and are commercially available from various optical suppliers, either as stock elements or elements that are made to order.

Although embodiments described above have been described particularly with reference to conventional active matrix LCD's (AMLCD), it is noted that other suitable electronic devices comprising arrays of light sensitive electronics, such as any substrate including arrays of thin film transistors, for example and without limitation OLED (organic light emitting diode) devices, may be tested employing the systems and methods described herein.

Typical array-type components that may be tested employing the systems and methods described herein, in addition to an array of transistors, include other electronic components associated with the transistors. Thus for example, typical AMLCD panels include at least one transistor for each pixel the display, as well as at least one capacitor each pixel. AMLCD panels may be tested during various stages of manufacture. For example testing may be performed after formation and interconnection of transistors but before the addition of ITO or IZO electrodes. Alternatively, panels may be tested using the systems and methods described herein after formation of the electrodes. Although the transistors are illuminated so as to generate a photoconductive induced current, measurement of the induced current (or of the voltage of the induced current) over time may be employed to characterize the functionality of the transistors or other micro electronic components associated with the transistors.

In accordance with an embodiment of the invention, the systems and methods described herein are employed for testing photo-conductive induced current at a "pre-final" stage after an active matrix of transistors has been formed. During this stage of production, all rows and all columns of a panel to be tested are still interconnected and thus shorted with suitable shorting bars, respectively referenced 50 and 60 in FIG. 1. At least one light beam scans individual transistors on the FPD panel. Transistors in an array to be tested are placed in darkness and biased in such a way that all of them are switched off so that only reverse-leakage current exists. Illumination of a channel of a particular TFT generates free charge carriers in the illuminated transistor, which are sensed as a current surge between the relevant source and gate shorting bars. The current is measured, for example either as current or as a voltage, at a common drain 70.

Figure 3A:
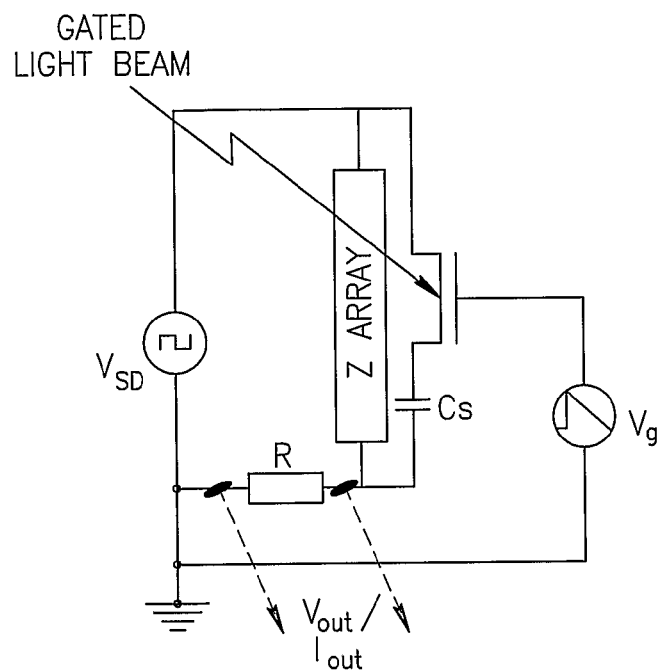
FIG. 3A is a simplified schematic illustration of a circuit for photoconductive effect-based testing of a pre-final stage TFT array.
Figure 3B:
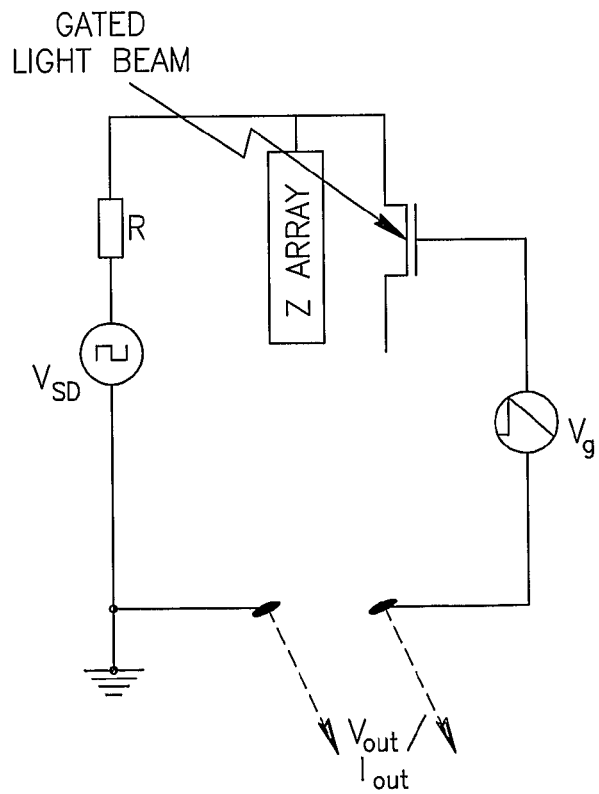
FIG. 3B is a simplified schematic illustration of a circuit for photoconductive effect-based testing of a pre-ITO stage TFT array.

Reference is made to FIG. 3A which schematically shows a typical single n-type TFT tested in accordance with an embodiment of the present invention; the tested TFT is part of an array Z of effective impedance since an FPD panel may be considered as a parallel array of pixels. By turning off groups of interconnected pixels, and maintaining a dark test environment, Vout need not be measured individually by probes positioned at each individual pixel as described in detail herein. FIG. 3A is useful in appreciating the respective inputs and outputs used for the testing of a transistor in a TFT array after the formation of pixel electrodes employed in AMLCD panels. FIG. 3B is useful in appreciating the respective inputs and outputs for testing a transistor in a TFT array prior to the formation of pixel electrodes employed in AMLCD panels. In both FIGS. 3A and 3B, a gate light beam illuminates a transistor associated with a pixel. As seen in FIGS. 3A and 3B, either voltage or current may be measured; namely as a function of the measuring apparatus that is selected for measurement.

In an embodiment of the present invention, only a selected transistor in a transistor array on a flat panel display, or in a region thereof electrically isolated from all remaining regions, is illuminated at any given time, while all the other transistors in the transistor array, or at least in the same region thereof, are maintained in darkness. Illumination of selected transistors is accomplished, for example, by scanning the light beam as seen with reference to FIG. 1.

Figure 4A:
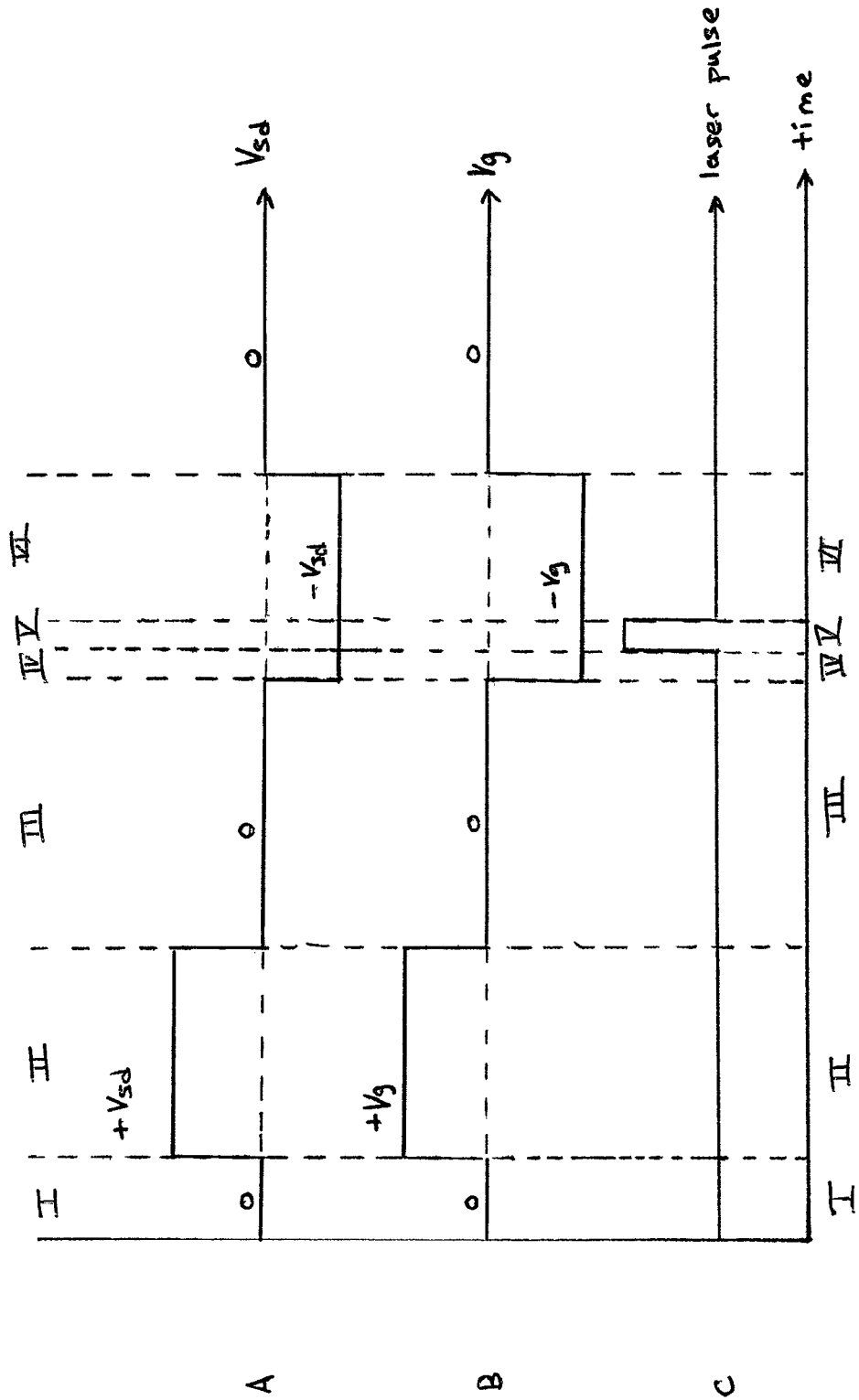
FIG. 4A is a simplified timing graph of input signals for testing a pre-final stage TFT array in accordance with an embodiment of the invention.

FIG. 4A is a collection of timing graphs (A), (B), (C) schematically illustrating the synchronized timing relationship of input signals, governing an n-type test transistor, by way of example ($V_{sd}$ and $V_g$ in FIG. 1), in a TFT pixel array for which an electrode has been formed, and illumination of the test transistor (e.g. by light beam 16 in FIG. 1) to induce a photoconductive effect.

In this embodiment, which illustrates signals that are input to a test circuit such as the circuit shown in FIG. 3A, time intervals I, II, III, IV, V and VI, as shown in the graph, correspond to the following phases:

Phase I: Vsd=Vg=0 no light. No response at common.

Phase II: Vsd and Vg receive positive voltage bias. This puts TFT into an "on" state. No light is provided. Current (dark current) is present, however in an embodiment this dark current is not measured.

Phase III: (same as phase I)

Phase IV: Vsd and Vg receive a negative voltage bias. This bias places the TFT in a deep "off" state. No light is provided. No response at common, other than leakage current.

Phase V: Vsd and Vg receive a negative voltage bias. This bias places the TFT in a deep "off" state. The TFT is illuminated by a light pulse, provided for example by a laser. In a normal non-defective transistor, a photoconductive induced current response is measurable at common.

Phase VI: (Same as phase IV)

Figure 4B:
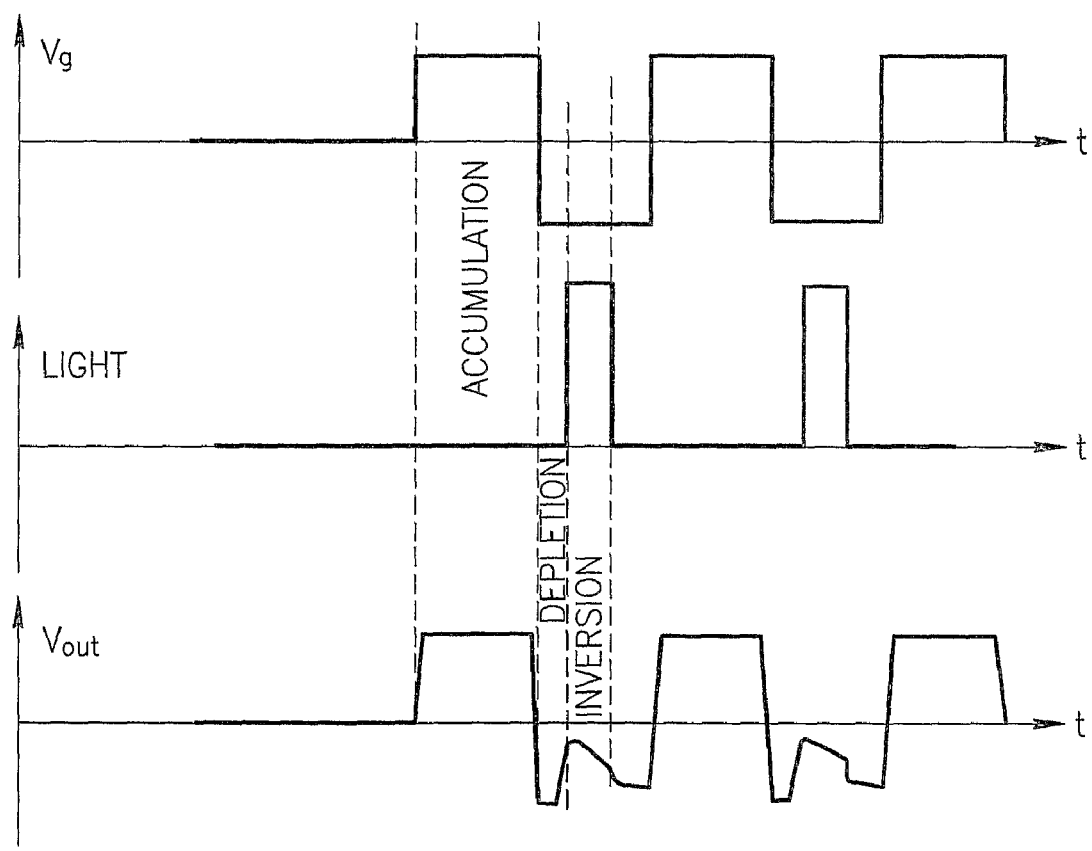
FIG. 4B is a simplified timing graph of input and output signals testing of a pre-ITO stage TFT array in accordance with an embodiment of the invention.

Reference is made to FIG. 4B which is a collection of timing graphs schematically illustrating the synchronized timing relationship of input signals governing a test transistor in a transistor array for which an electrode has not yet been formed, illumination of the transistor to induce a photoconductive effect, and an output signal as a result of illumination of a transistor in accordance with an embodiment of the invention.

In this embodiment, which corresponds to the testing of a circuit as illustrated in FIG. 3B, the transistors effectively behave as MOS (metallic oxide semiconductor) capacitors and only the address and data shorting bars are available to be biased. The bias is selected such that all interconnected MOS-capacitors are brought into a deep depletion state e.g. as shown in FIG. 4B, by application of a suitable signal $V_g$. Upon illuminating a particular MOS-capacitor with a focused beam of light, the illuminated MOS capacitor is rapidly transferred into inversion mode, as shown in FIG. 4B.

This process causes, upon illumination, the generation of an abundance of free charge carriers that result in change of the gate-to-source space charge distribution of the illuminated MOS capacitor. The measurement of current flow, or voltage, in this situation is carried out between common gate and data lines shown in the array of FIG. 3B. Based on the magnitude and form of the signal response, it is possible to identify possible shorts such as but not limited to Source/Drain, Source/Gate, Drain/Gate shorts.

In accordance with an embodiment of the invention, a single light beam is scanned over a panel including one or more interconnected transistor arrays, however this need not be the case. As the panel size of substrate panels for fabricating flat panel grows larger, it is appreciated that considering time constraints during fabrication for performing various tests, it may be more cost effective to provide several beams that simultaneously scan different portions of a substrate panel.

FIGS. 5-8 illustrate various methods for biasing the shorting bars of the TFT array of 30 of FIG. 1, so as to neutralize all transistors in the TFT array that may affect a transistor being tested. As noted above, putting TFTs in an off state eliminates noise resulting from dark current associated with TFTs that are in the "on" state thus facilitating measurement of current that is induced by illumination of given transistor in the TFT array, without influence from other transistors in the array.

Figure 5:
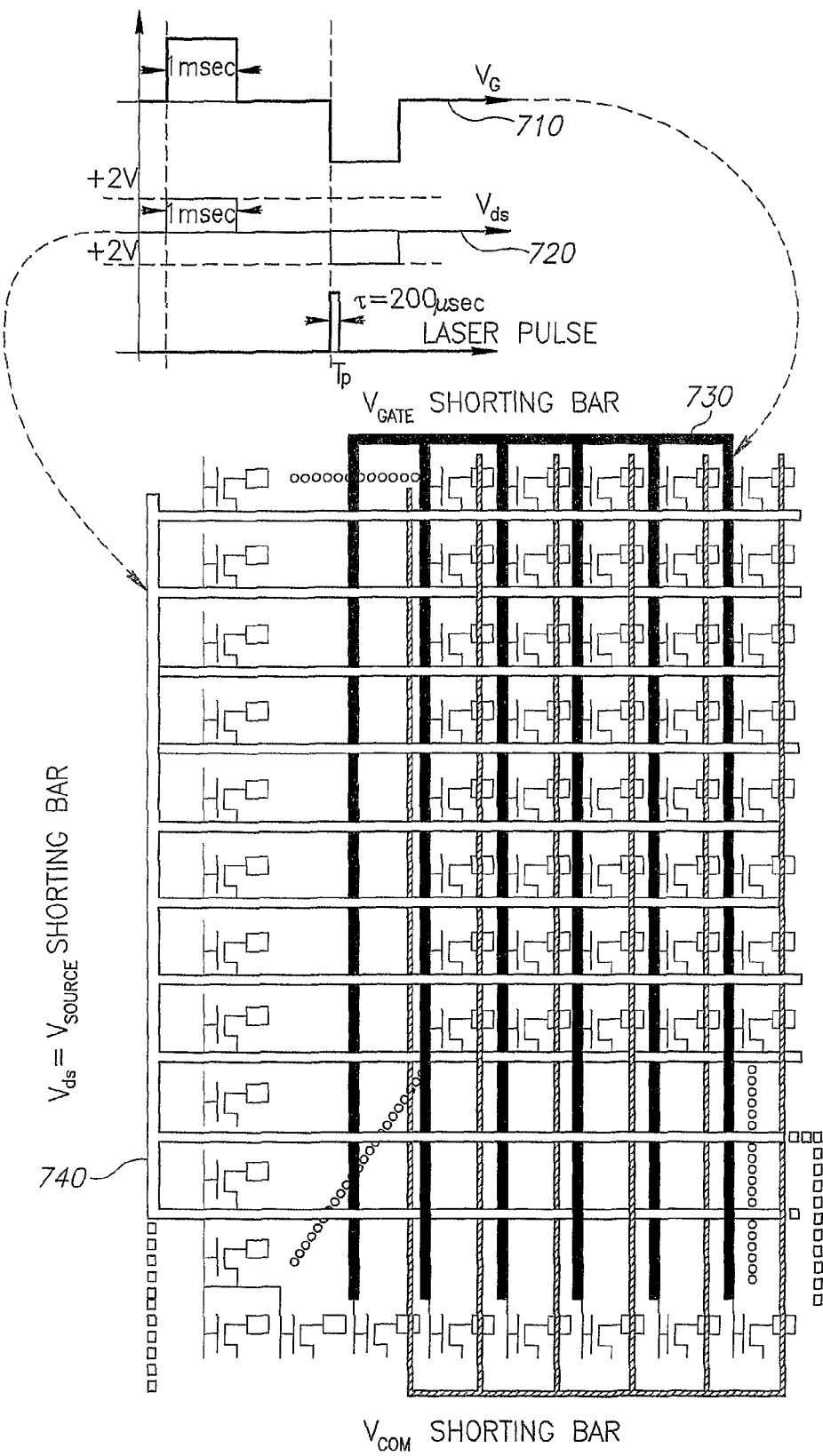
FIG. 5 is a simplified electronic diagram of a structure utilizing shorting bars to turn off all the transistors in an array or region thereof, in "storage on common"-type flat panel display apparatus having one-sided shorting bars.
Figure 6:
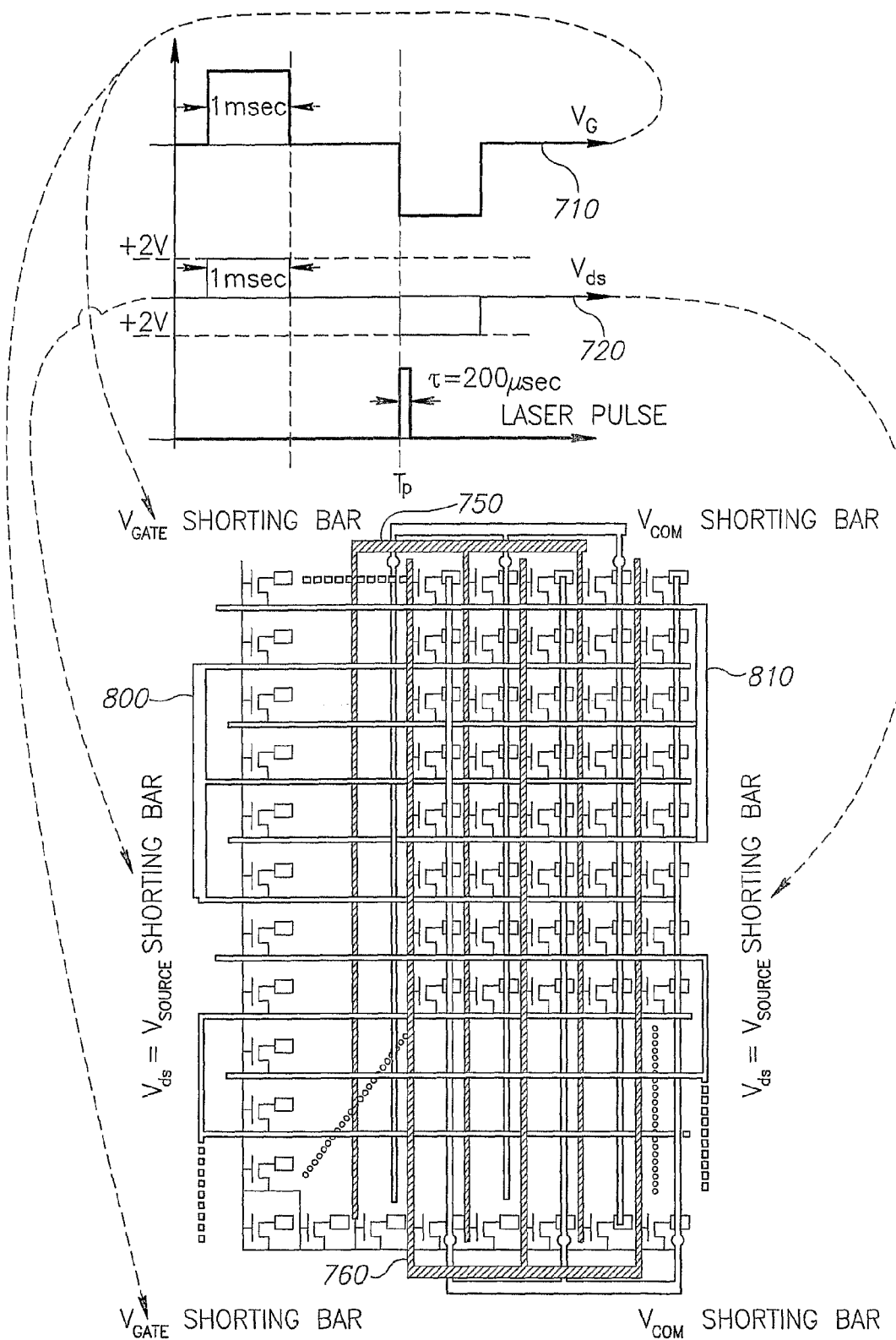
FIG. 6 is a simplified electronic diagram of a structure utilizing shorting bars to turn off all the transistors in an array or region thereof, in "storage on common"-type flat panel display apparatus having segmented shorting bars.
Figure 7:
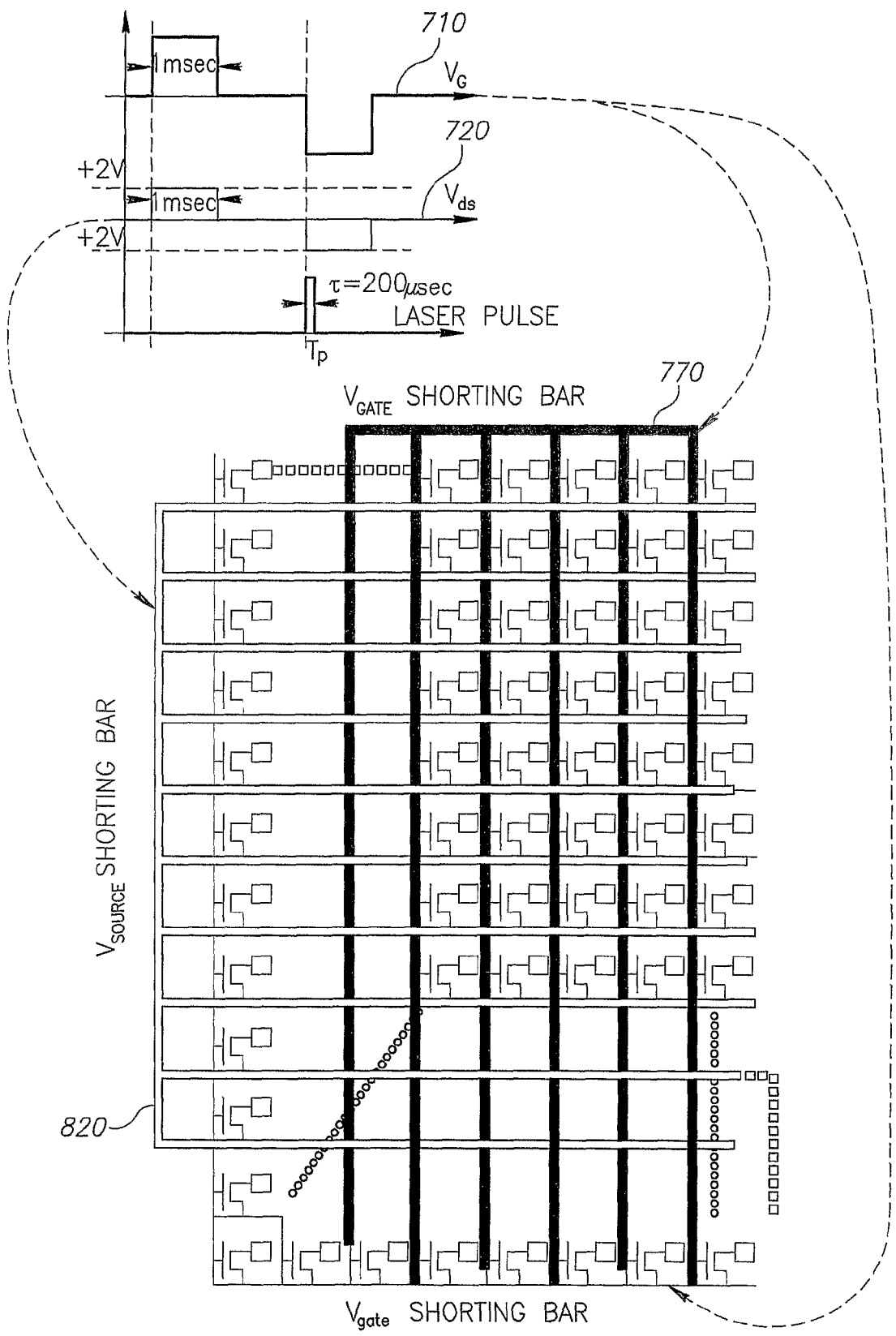
FIG. 7 is a simplified electronic diagram of a structure utilizing shorting bars to turn off all the transistors in an array or region thereof, in "storage on gate"-type flat panel display apparatus having one-sided shorting bars.
Figure 8:
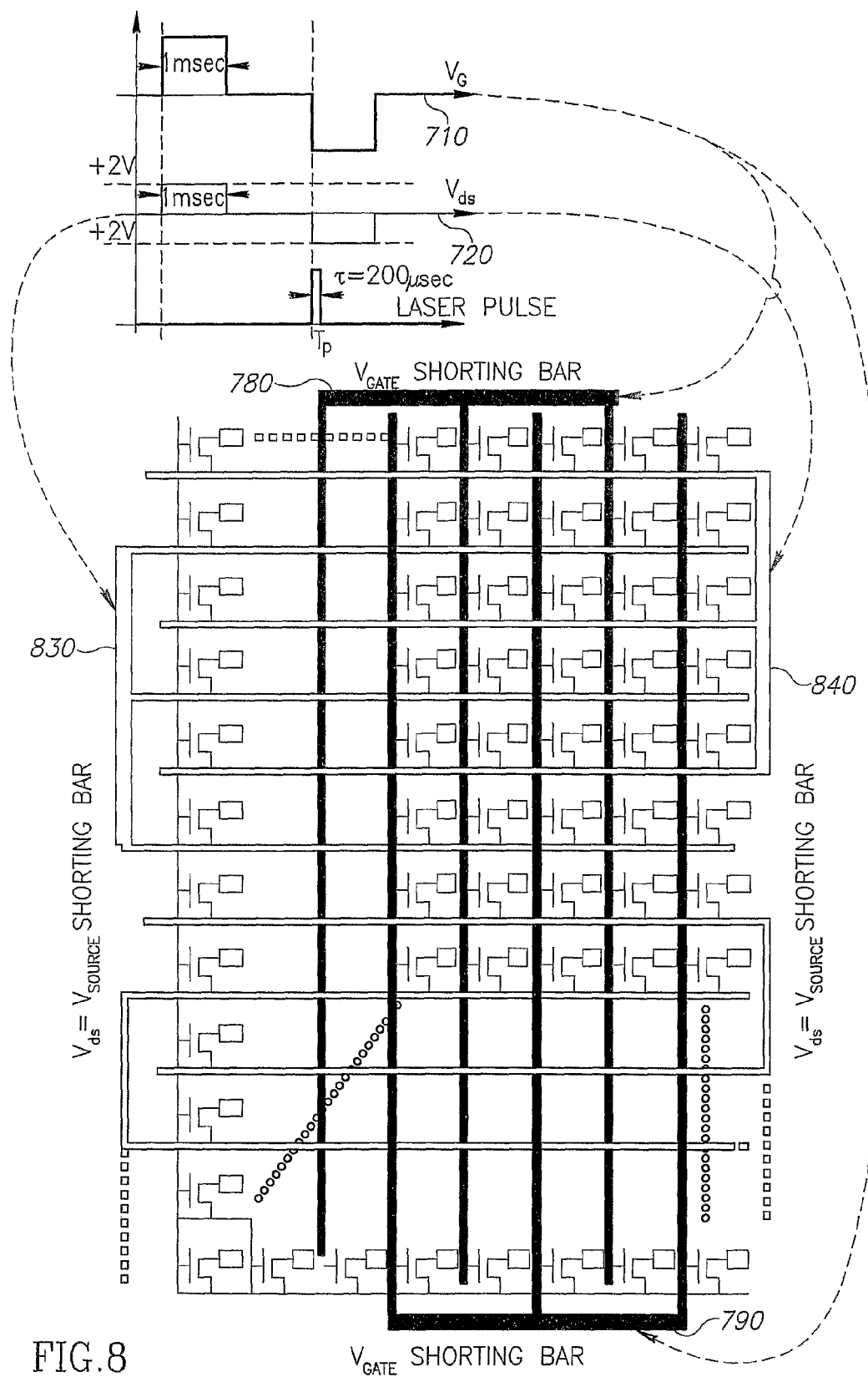
FIG. 8 is a simplified electronic diagram of a structure utilizing shorting bars to turn off all the transistors in an array or region thereof, in "storage on gate"-type flat panel display apparatus having segmented shorting bars.

It is appreciated that the particular transistor-shorting bar configuration of FIG. 1 is intended only to be illustrative and is shown merely by way of example. FIG. 5 shows biasing of shorting bars in a "storage on common" type of flat panel display apparatus having one-sided shorting bars. FIG. 6 shows biasing of shorting bars in a "storage on common"-type flat panel display apparatus having segmented shorting bars in which each shorting bar only interconnects selected rows, but not all rows continuously. FIG. 7 shows biasing of shorting bars in a "gate"-type flat panel display apparatus having one-sided shorting bars. FIG. 8 shows biasing of shorting bars in a "storage on gate"-type flat panel display apparatus having segmented shorting bars. As shown in all of FIGS. 5-8, the Vg bias 710 is applied to V-gate shorting bars 730, 750, 760, 770, 780 and 790 (corresponding to shorting bar 50 in FIG. 1) whereas the Vsd bias 720 is applied to the V-source shorting bars 740, 800, 810, 820, 830 and 840 (corresponding to shorting bar 60 in FIG. 1); timing graphs in each of FIGS. 4A-4B shows the synchronization in timing for application of a bias to the respective $V_g$ and $V_{sd}$ shorting bars, as well as the timing of a light pulse, provided for example by laser 14 of FIG. 1.

Transistors are illuminated only after change in polarity of the bias has been completed. Thus as seen in FIGS. 4A-4B, the drop in $V_g$ and $V_{sd}$ slightly precedes illumination. In an embodiment of the invention, the time interval by which the pulse is delayed relative to the change in polarity of the biasing is typically in the order of 50-200 microseconds. When a pulsed laser beam is used, the time delay for illuminating a transistor following change in the polarity of a bias is similar in order of magnitude to the pulse width of the laser pulse.

Figure 9:
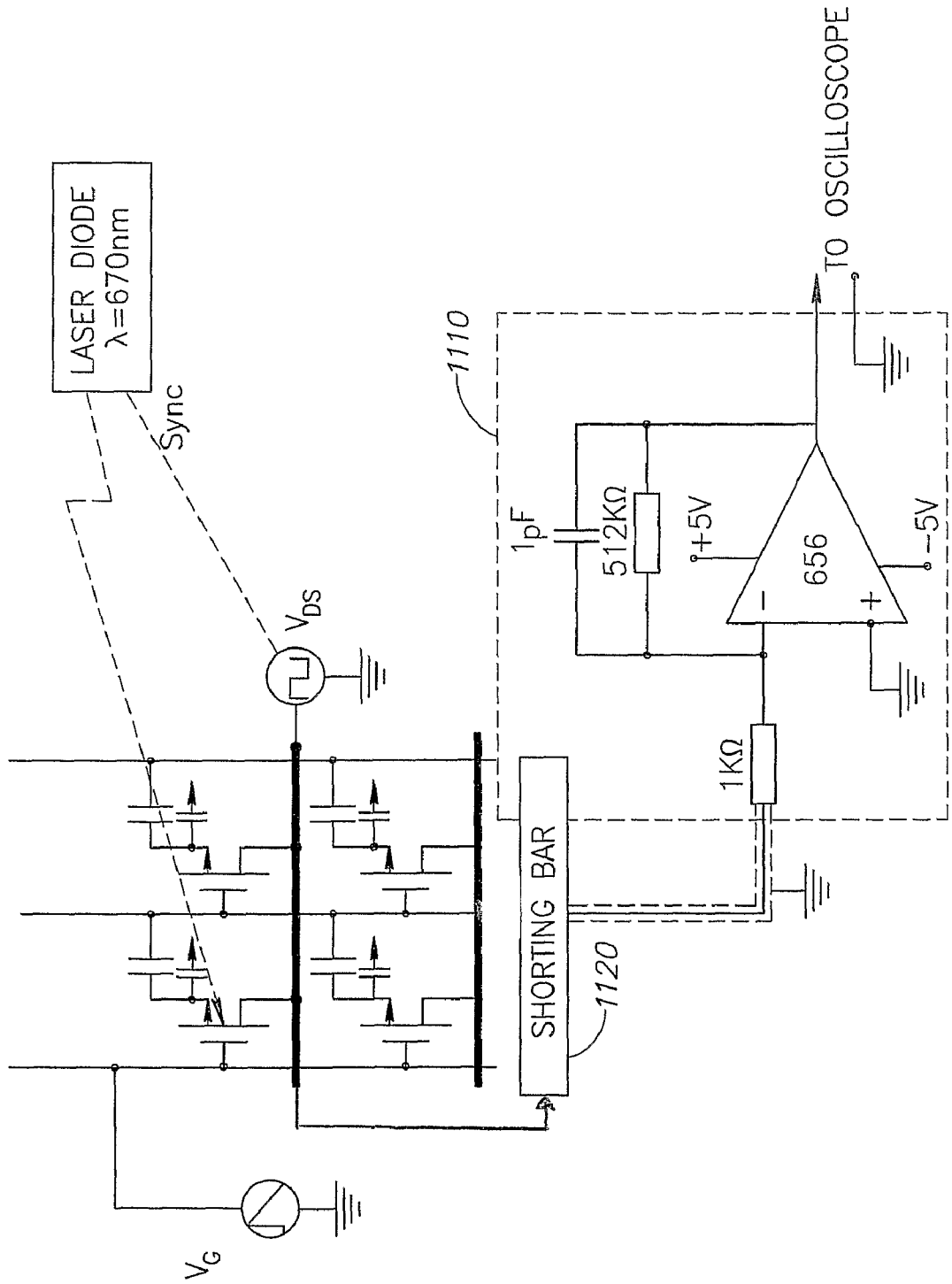
FIG. 9 is a simplified electronic diagram of a current sensing circuit operative to sense photoconductive effect induced current generated by the system of FIG. 1.

Reference is made to FIG. 9 which is a schematic electronic diagram of a current sensing circuit 1110 constructed and operative in accordance with an embodiment of the invention, that is suitable for sensing photoconductive effect-induced output current generated in the system of FIG. 1 upon illumination of a TFT in a "storage on gate"-type flat panel device. Circuit 1110 measures drain current input of the diagnostic method of FIG. 2B, for example. In the illustrated embodiment, measurements are taken from a shorting bar 1120.

Figure 10:
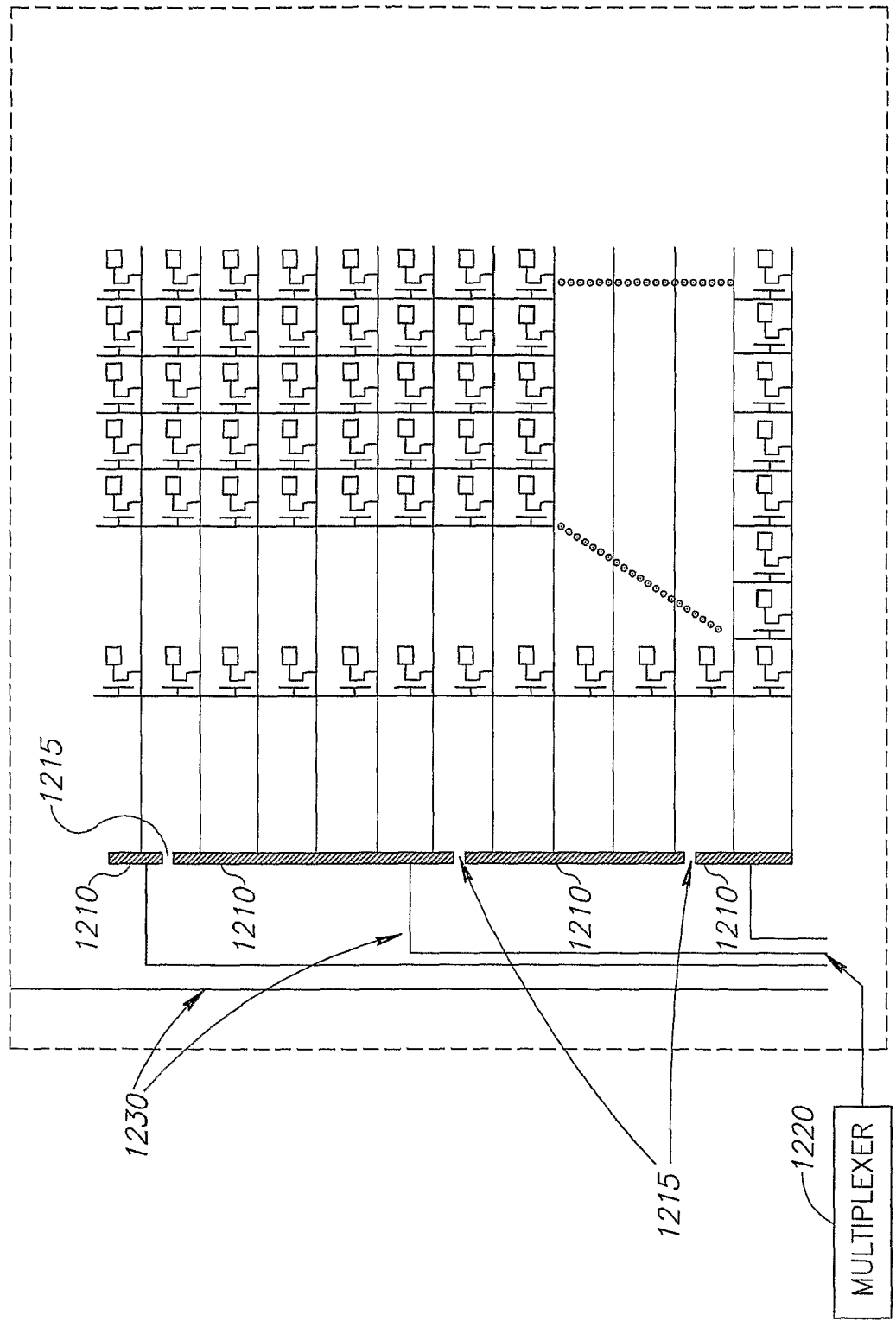
FIG. 10 is a simplified electronic diagram of a TFT array being tested in accordance with an embodiment of the present invention in which shorting bars are segmented.

In some applications, the vast quantity of transistors in an array disposed on a typically display panel may nevertheless produce sufficient leakage current, despite the transistors being in an "off state", so as to obscure the photoconductive effect current that is induced in accordance with embodiments of the present invention. In accordance with an embodiment of the invention, segmented shorting bars 1210 having stops 1215 defined between segments, as seen in FIG. 10, are adapted to activate subgroups of TFTs in a larger array. The segmented shorting bars may be employed in place of or in addition to conventional shorting bars, for example as shown in FIGS. 5-8.

Segmented shorting bars 1210 interconnect a relatively small number of gate lines or source lines, for example only a few hundred gate lines or short lines per segmented shorting bar (although only a far smaller number of gate and short lines is shown in FIG. 10). A physical or logical multiplexer 1220 is operationally connected to leads 1230 respectively activating each of the segmented shorting bars 1210. Multiplexer 1220 selects a subset of the typically millions of transistors present in TFT array. A current or voltage sensing circuit, such as that shown and described hereinabove in conjunction with FIG. 9 for example thus measures current induced in a single TFT among a subset of substantially fewer than one million transistors.

Figure 11:
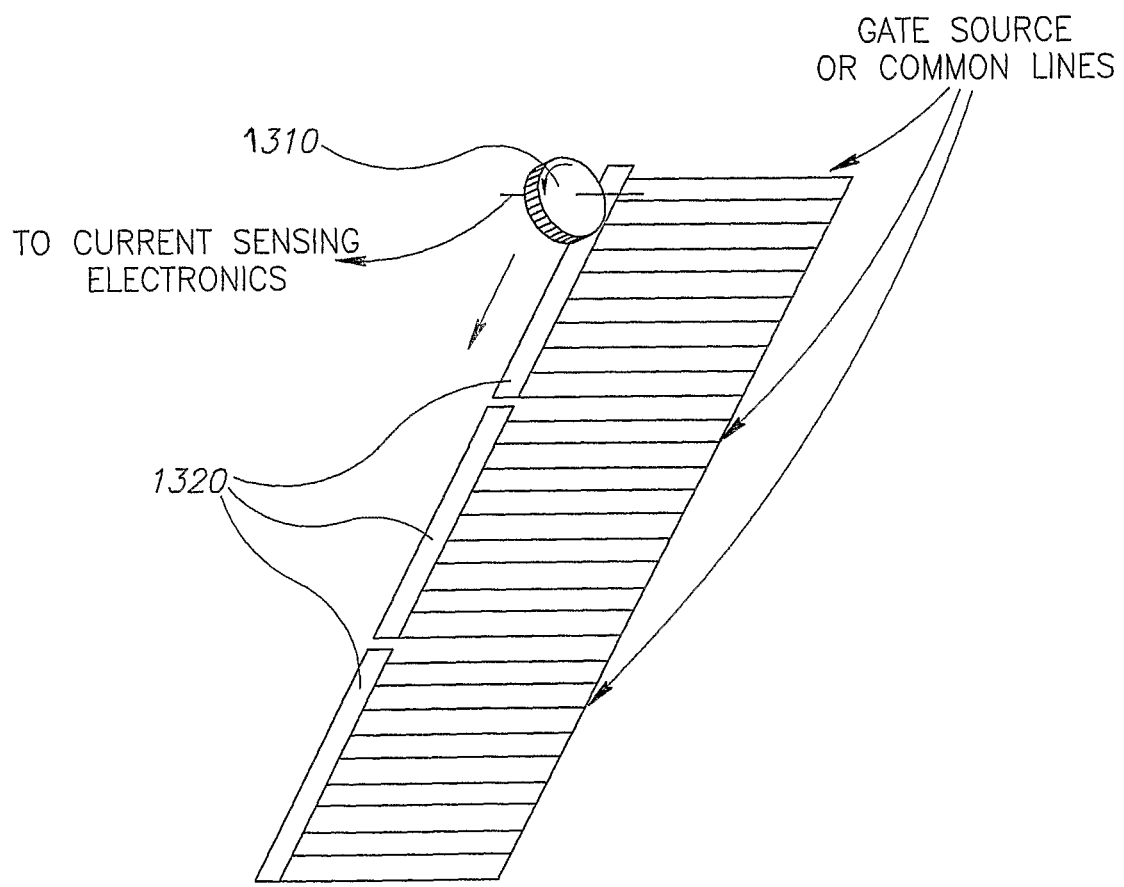
FIG. 11 is a simplified pictorial diagram of a TFT array being tested in accordance with an embodiment of the present invention in which a sliding contact is employed.

Alternatively, as shown in FIG. 11, the electrical signal sensing circuit, e.g. oscilloscope of FIG. 9, may be associated with substrate 30 (FIG. 1) having an array of TFTs 12 formed thereon interconnected by segmented shorting bars 1320, corresponding to shorting bars 50, 60 and 70 in FIG. 1. A sliding electrode 1310 or contact may be configured, for example, as a wheel or brush (a conductive wheel being shown although other configurations may be contemplated) that slides along segmented shorting bars 1320 to establish electrical contact with a sub group of TFTs 12 that is being tested. The sliding electrode 1310 is typically formed of a conductive material and is delicate enough to avoid damage to the surface of the substrate as it slides therealong. Alternatively, the sliding electrode 1310 directly contacts gate, source or common lines, and is configured to have a width corresponding to the number of lines that are desired to be contacted at any given time.

It is noted that the invention shown and described herein is not limited to n-type transistors; rather these are described herein merely by way of example.

Figure 12:
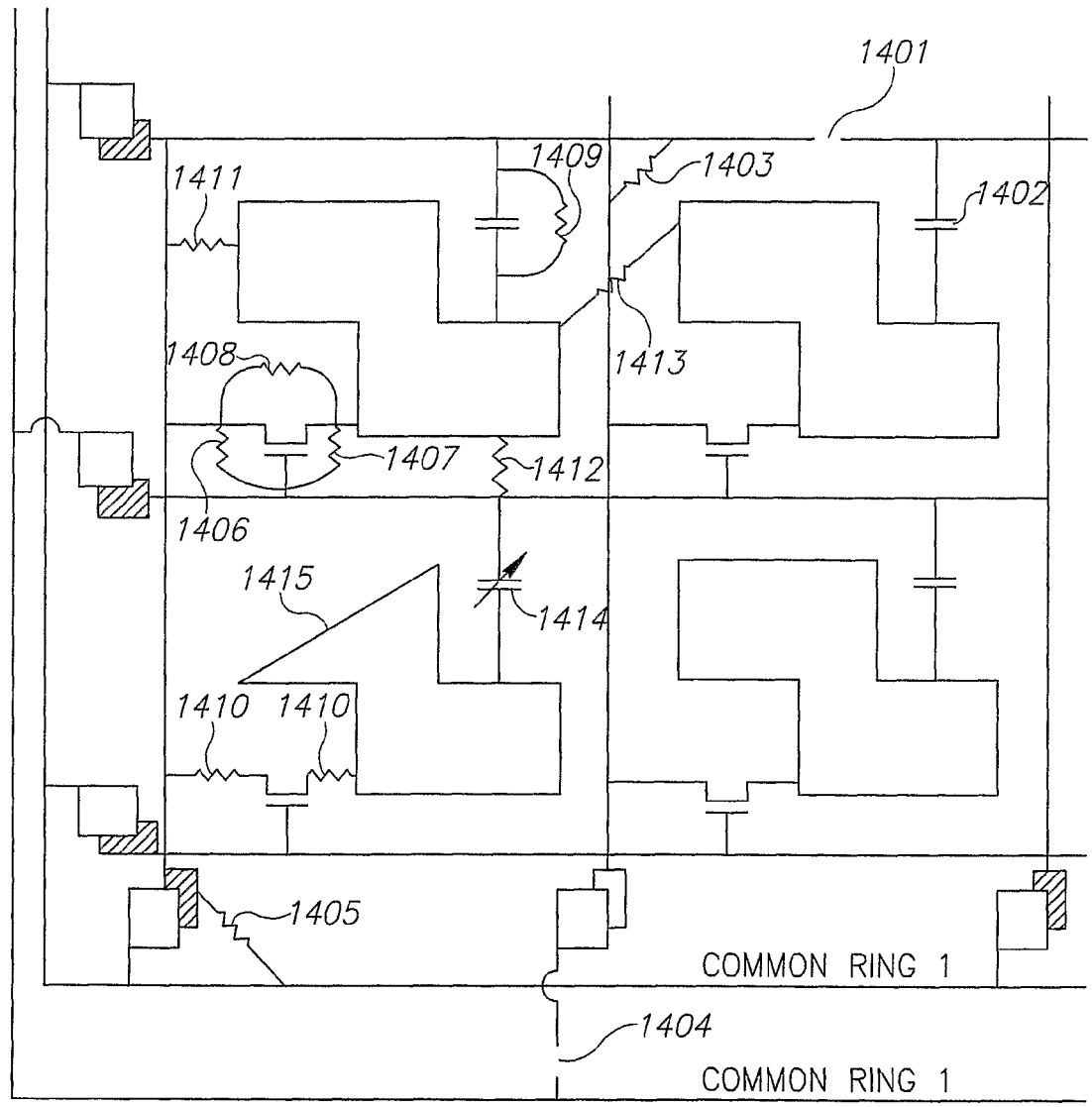
FIG. 12 is a simplified schematic diagram of a circuit tested in using apparatus and methods in accordance with an embodiment of the invention, illustrating different kinds of defects on the circuit.

Reference is made to FIG. 12, showing several different defects that may be tested employing the system and methods shown and described herein above. Thus the system and method shown and described herein is suitable for detecting and preferably differentiating between a wide variety of defects such as but not limited to some or all of the following types of defects in the illustrated circuit: break in gate line 1401, break in data line 1402, short between data line and gate 1403, break in shorting bus 1404, short between a pad and a shorting bus 1405, drain-to-gate short 1406, source-to-gate short 1407, drain-to-source short 1408, short in storage capacitor Cs 1409, poor TFT connection 1410, pixel-electrode-to-data line short 1411, pixel-electrode-to-gate-line short 1412, short between pixel electrodes 1413, storage capacitor variation 1414. These defects may be detected either prior or subsequent to forming an electrode, such as an ITO or IZO electrode. Each of these defects results in a characteristically different response to photoconductively induced current.

According to one embodiment of the invention, the system may comprise one or more computers or other programmable devices, programmed in accordance with some or all of the apparatus, methods, features and functionalities shown and described herein. Alternatively or in addition, the apparatus of the present invention may comprise a memory which is readable by a machine and which contains, stores or otherwise embodies a program of instructions which, when executed by the machine, comprises an implementation of some or all of the apparatus, methods, features and functionalities shown and described herein. Alternatively or in addition, the apparatus of the present invention may comprise a computer program implementing some or all of the apparatus, methods, features and functionalities shown and described herein and being readable by a computer for performing some or all of the methods of, and/or implementing some or all of the systems of, embodiments of the invention as described herein.

It is appreciated that software components of the present invention may, if desired, be implemented in ROM (read only memory) form. The software components may, generally, be implemented in hardware, if desired, using conventional techniques. Features of the present invention which are described in the context of separate embodiments may also be provided in combination in a single embodiment. Conversely, features of the invention which are described for brevity in the context of a single embodiment may be provided separately or in any suitable subcombination.

The invention claimed is:

1. A method for inspecting microelectronic components on a substrate, the method comprising:
    applying a control signal to a plurality of microelectronic components disposed on a substrate so as to cyclically place the plurality of microelectronic components in an off state;
    inducing a photoconductive response by scanning the plurality of microelectronic components with at least one light beam so as to illuminate at least one microelectronic component of the plurality of microelectronic components, wherein said scanning is synchronized with said applying the control signal, such that the at least one microelectronic component is illuminated when it is in the off state; and
    during said scanning, measuring, via a wiring line, an electronic response output from the at least one microelectronic component due to the photoconductive response, thereby to detect an electric characteristic.

2. A method according to claim 1, wherein said scanning the multiplicity of microelectronic components comprises maintaining in darkness the plurality of microelectronic components, except for the at least one component illuminated by the light beam.

3. A method according to claim 1, wherein the at least one light beam creates an illumination spot which illuminates a plurality of microelectronic components at a time.

4. A method according to claim 1 wherein each of the plurality of microelectronic components comprises at least one of the following: a transistor, a capacitor and a diode.

5. A method according to claim 1 wherein the microelectronic components are arranged in an array.

6. A method according to claim 1 wherein the light beam comprises at least one laser beam.

7. A method according to claim 6 wherein said scanning comprises pulsing the at least one laser beam during said scanning.

8. A method according to claim 1 wherein the light beam comprises a pulsed laser beam and said scanning comprises generating at least one sequence of laser beam pulses timed such that each individual pulse is sequentially delivered to at least one of the plurality of microelectronic components.

9. A method according to claim 8 wherein the at least one sequence of laser beam pulses comprises a plurality of sequences of pulses, and said scanning comprises delivering each sequence of pulses to an electronically isolated group of microelectronic components of the plurality microelectronic components.

10. A method according to claim 1 wherein the at least one light beam comprises a laser beam and said scanning comprises focusing the laser beam to form a spot spatially corresponding to a single microelectronic component and scanning the spot to cyclically illuminate each of the plurality of microelectronic components.

11. A method according to claim 10 wherein each of the plurality of microelectronic components circuitry in a display pixel.

12. A method according to claim 1 wherein the electronic response comprises electrical current emitted from a single microelectronic component.

13. A method according to claim 1 wherein the electronic response comprises electrical voltage associated with a single microelectronic component.

14. A method according to claim 1 wherein the control signal is applied simultaneously to more than one of the plurality of microelectronic components.

15. A method according to claim 1 wherein said measuring the electronic response comprises simultaneously measuring electronic responses from more than one of the plurality of microelectronic components.

16. A method according to claim 1 and also comprising comparing the measured electronic response from at least one microelectronic component to a reference response, and determining therefrom whether at least one of the at least one microelectronic components is defective.

17. A method according to claim 1 wherein the at least one light beam comprises a plurality of light beams provided by a corresponding plurality of light sources.

18. A method according to claim 1 wherein the substrate comprises a pre-electrode manufacturing stage flat panel display transistor array.

19. A method according to claim 1 wherein the substrate comprises a pre-final production stage flat panel display transistor array.

20. An apparatus for testing microelectronic components on a substrate, comprising:
a scanner operative to induce photoconductive responses in a plurality of thin film transistors, one transistor at a time, by scanning a light beam over the plurality of transistors disposed on a flat panel display substrate;
current sensing circuitry, electrically connected to a wiring line of the plurality of transistors and synchronized with said scanner, which is operative to measure an output induced by the photoconductive responses associated with a the plurality of transistors and to generate photoconductive response output values, the photoconductive response output values representing the photoconductive responses induced by the light beam, for one transistor at a time of the plurality of transistors; and
a diagnostic apparatus operative to analyze the electronic response output values and to characterize the transistors in accordance therewith.

21. Apparatus according to claim 20 further comprising at least one signal generator operative to provide an electrical signal to selected transistors synchronously with said scanner.

22. Apparatus according to claim 21, wherein said at least one signal generator comprises a first signal generator generating a first electrical signal that is applied via a gate line to a plurality of transistors to render the plurality of transistors unavailable to respond to a data signal.

23. Apparatus according to claim 22, wherein the first electrical signal comprises a voltage signal.

24. Apparatus according to claim 22, wherein said at least one signal generator further comprises a second signal generator generating a second electrical signal that is applied via a data line to the plurality of transistors, synchronously with the first electrical signal, such that absent additional excitation, upon application of the second electrical signal, current does not normally flow through the plurality of transistors.

25. Apparatus according to claim 24, wherein the second electrical signal comprises a voltage signal.

26. Apparatus according to claim 20 wherein the flat panel display substrate comprises at least one shorting bar, and wherein the apparatus further comprises a biasing unit electrically connected to the at least one shorting bar.

27. Apparatus according to claim 26, wherein said biasing unit comprises first and second signal generators.

28. Apparatus according to claim 26 wherein the at least one shorting bar is segmented, wherein each segment of the at least one shorting bar is electrically connected to one of a plurality of subsets of transistors of the plurality of transistors, such that the induced output measured by said current sensing circuitry is current flowing through one of the plurality of subsets of transistors.

29. Apparatus according to claim 26 wherein said current sensing circuitry also comprises a sliding contact slidable over the substrate, and wherein said current sensing circuitry is operative to measure the output induced by the photoconductive responses associated with transistors electrically connected to said sliding contact.

30. A method of inspecting a plurality of transistors on a substrate, the method comprising:
cyclically applying a control signal to the plurality of transistors thus cyclically placing the plurality of transistors in an off state;
inducing photoconductive responses in the plurality of transistors by scanning a light beam over the plurality of transistors, synchronously with the applying the control signal;
measuring electronic responses output from the drains of the plurality of transistors;
determining whether or not each of the plurality of transistors is defective based on the measured electronic responses.

31. The method according to claim 30, wherein applying the control signal and the scanning the light beam synchronously with the applying the control signal comprises, for each of the plurality of transistors:
first applying a negative bias voltage to a source line connected to the transistor and applying a negative bias voltage to a gate line connected to the transistor, and
subsequently inducing the photoconductive response by illuminating the transistor with the light beam while the transistor is in the off state.

32. An apparatus for inspecting a plurality of transistors on a substrate, the apparatus comprising:
a signal generator which cyclically applies a control signal to the plurality of transistors, thus cyclically placing the plurality of transistors in an off state;
a scanner, which induces a photoconductive response by scanning a light beam over the plurality of transistors,
a signal analyzer, electrically connected to drains of the plurality of transistors, which receives photoconductively-induced current output from the plurality of transistors, and generates a test report indicating whether the plurality of transistors are defective, based on the photoconductively-induced current; and
a synchronizer which controls the signal generator and the scanner, such that the control signal and the light beam are synchronized.

33. The apparatus according to claim 32, wherein the control signal comprises a negative bias voltage applied to a source line and a negative bias voltage applied to a gate line.

* * * * *